(12) United States Patent
Wasyluk et al.

(10) Patent No.: US 8,703,620 B2
(45) Date of Patent: *Apr. 22, 2014

(54) METHODS FOR PFET FABRICATION USING APM SOLUTIONS

(75) Inventors: Joanna Wasyluk, Dresden (DE); Stephan Kronholz, Dresden (DE); Berthold Reimer, Dresden (DE); Sven Metzger, Dresden (DE); Gregory Nowling, San Jose, CA (US); John Foster, Mountain View, CA (US); Paul Besser, Sunnyvale, CA (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 13/564,071

(22) Filed: Aug. 1, 2012

(65) Prior Publication Data
US 2013/0203245 A1 Aug. 8, 2013

Related U.S. Application Data

(63) Continuation-in-part of application No. 13/368,055, filed on Feb. 7, 2012.

(51) Int. Cl.
*H01L 21/302* (2006.01)

(52) U.S. Cl.
USPC ........... 438/734; 438/689; 438/704; 438/745; 257/E21.618; 257/E21.633

(58) Field of Classification Search
None
See application file for complete search history.

(56) References Cited

U.S. PATENT DOCUMENTS

| 7,241,700 B1 * | 7/2007 | En et al. ............. 438/745 |
| 7,344,999 B2 | 3/2008 | Mun et al. |
| 7,354,868 B2 | 4/2008 | Kwon et al. |
| 2008/0308872 A1 * | 12/2008 | Bu et al. ............. 257/369 |
| 2010/0068874 A1 | 3/2010 | Chang |

OTHER PUBLICATIONS

USPTO, Office Action for U.S. Appl. No. 13/368,055, mailed Apr. 10, 2013.

* cited by examiner

*Primary Examiner* — Julio J Maldonado
*Assistant Examiner* — Joseph Galvin, III
(74) *Attorney, Agent, or Firm* — Ingrassia Fisher & Lorenz, P.C.

(57) ABSTRACT

A method for fabricating an integrated circuit from a semiconductor substrate having formed thereon over a first portion of the semiconductor substrate a hard mask layer and having formed thereon over a second portion of the semiconductor substrate an oxide layer. The first portion and the second portion are electrically isolated by a shallow trench isolation feature. The method includes removing the oxide layer from over the second portion and recessing the surface region of the second portion by applying an ammonia-hydrogen peroxide-water (APM) solution to form a recessed surface region. The APM solution is provided in a concentration of ammonium to hydrogen peroxide ranging from about 1:1 to about 1:0.001 and in a concentration of ammonium to water ranging from about 1:1 to about 1:20. The method further includes epitaxially growing a silicon-germanium (SiGe) layer on the recessed surface region.

10 Claims, 3 Drawing Sheets

METHODS FOR PFET FABRICATION USING APM SOLUTIONS

CROSS-REFERENCE TO RELATED APPLICATIONS

The present application is a continuation-in-part of U.S. patent application Ser. No. 13/368,055, filed Feb. 7, 2012, and titled: "METHODS FOR PFET FABRICATION USING APM SOLUTIONS." The contents of this application are incorporated herein by reference in their entirety.

TECHNICAL FIELD

The present invention generally relates to methods for fabricating an integrated circuit, and more particularly relates to methods for p-type field effect transistor (pFET) fabrication using ammonia-hydrogen peroxide-water (APM) solutions.

BACKGROUND

As FET (field effect transistor) devices are being scaled down, the technology becomes more complex, and changes in device structures and new fabrication methods are needed to maintain the expected performance improvements from one successive device generation to the next. Performance may be enhanced by independent optimization of FET device parameters, including those for both p-type and n-type FETs.

Standard components of a FET are the source, the drain, the channel in between the source and the drain, and the gate. The gate overlies the channel and is capable of inducing a current in the channel between the source and the drain. The gate is typically separated from the channel by the gate insulator, or gate dielectric. Depending whether the "on state" current in the channel is carried by electrons or by holes, the FET comes in two kinds: as nFET or pFET. It is also understood that frequently nFET and pFET devices are used together in circuits. Such nFET, pFET combination circuits, known generally as complementary metal oxide semiconductors (CMOS), may find application in analog and digital integrated circuits.

In the fabrication of integrated circuits, one technique that has been found to be advantageous for the pFET device, as well as other FET devices, is to have a channel region formed of a material that exhibits a higher conductivity than pure Si. For example, SiGe may be used as the pFET channel material to enhance electron mobility in the channel. The SiGe channel may be grown using selective epitaxial growth techniques. When using selective epitaxial growth for channel materials on a desired device, a hard-mask material such as silicon dioxide ($SiO_2$) or silicon nitride ($Si_3N_4$) may be used to protect against growth of new channel material on other parts of the circuit, such as an nFET device. Growth of the SiGe channel occurs only on crystalline material, not the oxides or nitrides. The hard-mask material is then removed after growth of the SiGe channel is complete.

FIGS. 1-3 illustrate an exemplary fabrication technique currently known in the art for pFET fabrication with a SiGe channel. As shown in FIG. 1, a complementary metal-oxide semiconductor (CMOS) FET circuit is provided that includes a pFET 30, an nFET 35, and a shallow trench isolation (STI) feature 15 between the pFET 30 and the nFET 35. The STI 15, made of a dielectric material such as silicon dioxide, provides electrical isolation between the adjacent semiconductor device components. The nFET 35 includes a hard-mask material 10, such as a hard-mask oxide, to protect the nFET 35 during the growth of channel material on the neighboring pFET 30. Both the pFET 30 and the nFET 35 include an "active" surface 31, 36 respectively, the uppermost surface of the silicon substrate at each respective device at this point in the fabrication process.

At FIG. 2, the native oxide 20 overlaying the pFET 30 (e.g., silicon dioxide) is removed with an oxide etchant, such as hydrofluoric acid (HF), to expose the pFET active surface 31. The oxide etchant also etches a portion of the STI 15 and the hard-mask material 10. At FIG. 3, SiGe is epitaxially grown on the pFET 30 to form a SiGe channel 40. As a result of the growth of the SiGe, however, there is a "step-height" difference 47 between the pFET active surface 31, which is now on top of the SiGe channel 40, and the nFET active surface 36 (shown as distance between parallel dashed lines and shown by double-headed arrow 47). Different size STI divots 45 (amount of STI oxide "pull-down" or height difference immediately next to the pFET SiGe channel 40) may also occur between nFET and pFET devices, due to the formation of the SiGe channel 40 on the Si material only, and not on oxides or nitrides. Step-height differences 47 and divots 45 can create structural topography problems in downstream processing, such as missing high-K material, also known as an encapsulation breach. Encapsulation breaches can result in a lower yielding fabrication process.

As such, there is a need in the art for improved integrated circuit fabrication techniques. Further, there is a need in the art for integrated circuit fabrication techniques that reduce or eliminate the amount and size of step-height differences and divots produced as a result of SiGe channel growth on a pFET. These and other desirable features are provided and will become apparent from the subsequent detailed description and the appended claims, taken in conjunction with the accompanying drawings and the foregoing technical field and background.

BRIEF SUMMARY

Methods are provided for fabricating an integrated circuit. In accordance with one embodiment, disclosed is a method for fabricating an integrated circuit from a semiconductor substrate having formed thereon over a first portion of the semiconductor substrate a hard mask layer and having formed thereon over a second portion of the semiconductor substrate an oxide layer. The first portion and the second portion are electrically isolated by a shallow trench isolation feature. The method includes removing the oxide layer from over the second portion by applying a dilute hydrogen fluoride solution to expose a surface region of the second portion and recessing the surface region of the second portion by applying an ammonia-hydrogen peroxide-water (APM) solution to form a recessed surface region. The APM solution is provided in a concentration of ammonium to hydrogen peroxide ranging from about 1:1 to about 1:0.001 and in a concentration of ammonium to water ranging from about 1:1 to about 1:20. The method further includes epitaxially growing a silicon-germanium (SiGe) layer on the recessed surface region to a height approximating a surface region of the first portion below the hard mask layer.

In accordance with a further embodiment, disclosed is a method for fabricating an integrated circuit from a semiconductor substrate having formed thereon over a first portion of the semiconductor substrate a hard mask layer and having formed thereon over a second portion of the semiconductor substrate an oxide layer. The first portion and the second portion are electrically isolated by a shallow trench isolation feature. The method includes removing the oxide layer from over the second portion by applying a dilute hydrogen fluoride solution to expose a surface region of the second portion and recessing the surface region of the second portion by applying one or more of: choline hydroxide, ammonium hydroxide, tetraethylammonium hydroxide, CLκ-888™, EKC162™, and ammonia-hydrogen peroxide-water (APM) in solution to form a recessed surface region. If an APM solution is applied, the APM solution is provided in a concentration of ammonium to hydrogen peroxide ranging from about 1:10 to about 1:0.001 and in a concentration of ammonium to water ranging from about 1:1 to about 1:20. The method further includes epitaxially growing a silicon-germanium (SiGe) layer on the recessed surface region to a height approximating a surface region of the first portion below the hard mask layer.

In accordance with yet another embodiment, disclosed is a method for fabricating an integrated circuit from a semiconductor substrate having formed thereon over a first portion of the semiconductor substrate a hard mask layer and having formed thereon over a second portion of the semiconductor substrate an oxide layer. The first portion and the second portion are electrically isolated by a shallow trench isolation feature. The method includes removing the oxide layer from over the second portion to a surface region of the second portion and recessing the surface region of the second portion in a single process step by applying a solution of about 1:300 dilute hydrogen fluoride and one or more of: choline hydroxide, ammonium hydroxide, tetraethylammonium hydroxide, CLκ-888™, EKC162™, and ammonia-hydrogen peroxide-water (APM) to form a recessed surface region. If an APM solution is applied, the APM solution is provided in a concentration of ammonium to hydrogen peroxide ranging from about 1:10 to about 1:0.001 and in a concentration of ammonium to water ranging from about 1:1 to about 1:20. The method further includes epitaxially growing a silicon-germanium (SiGe) layer on the recessed surface region to a height approximating a surface region of the first portion below the hard mask layer.

BRIEF DESCRIPTION OF THE DRAWINGS

The present invention will hereinafter be described in conjunction with the following drawing figures, wherein like numerals denote like elements, and wherein.

The figures presented herein are intended to be broadly illustrative of the methods disclosed herein, and as such are not intended to be to-scale or otherwise exact with regard to the integrated circuits produced in accordance with said method.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

This invention establishes methods for fabricating an integrated circuit wherein the Si material that forms a pFET is recessed to a depth such that upon epitaxial growth of a SiGe channel on the pFET, there is a reduced or negligible step-height difference between the active surface of the pFET and nFET portions of the circuit, and further there is reduced or negligible divot formation at the STI feature. In accordance with one embodiment, Si recessing at the pFET is accomplished using an ammonia-hydrogen peroxide-water (APM) solution at concentrations and for times as will be discussed in greater detail below. In accordance with another embodiment, Si recessing at the pFET is accomplished using a solution including one or more of choline hydroxide, ammonium hydroxide, tetraethylammonium hydroxide, CLκ-888™ (active ingredient sulfolane), EKC162™ (active ingredient hydroxylamine and quaternary ammonium hydroxide), and APM.

FIGS. 4-7 illustrate, in cross section, an exemplary method in accordance with one embodiment of the present invention. As shown therein, at FIG. 4, a complementary metal-oxide semiconductor (CMOS) circuit is provided that includes a pFET 30, an nFET 35, and a shallow trench isolation (STI) feature 15 between the pFET 30 and the nFET 35. An STI 15 is provided between the pFET 30 and the nFET 35 to prevent electrical current leakage between the adjacent semiconductor device components. The nFET 35 includes a hard-mask material 10, such as a hard-mask oxide, to protect the nFET 35 during the deposition of channel material on the neighboring pFET 30.

Figure 5:
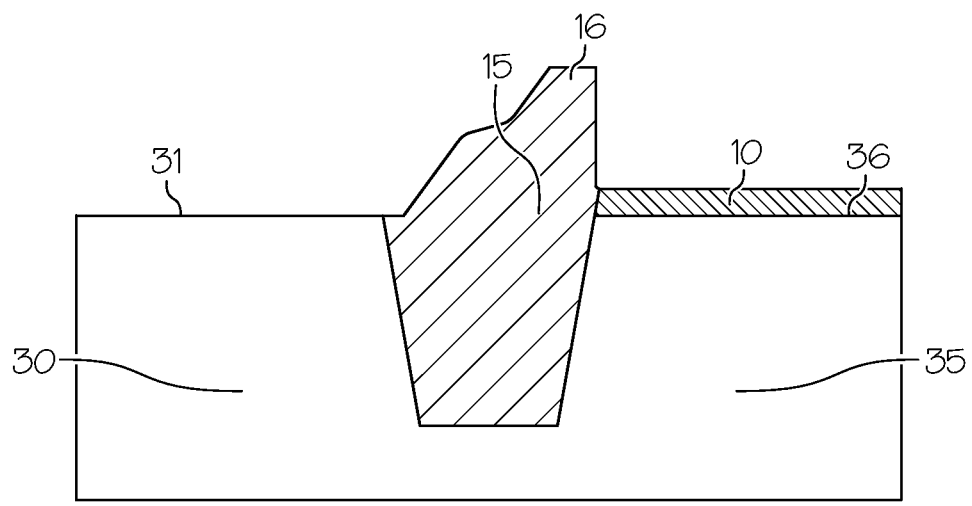

At FIG. 5, the native oxide 20, which is a product of previous processing steps or exposure to an oxygen containing environment, is removed with an oxide etchant, such as about 1:300 dHF (dilute hydrogen fluoride), in a pre-clean step. The oxide etchant also etches a portion of the STI 15 and the hard-mask material 10. As shown, the STI 15 also typically will include a feature 16 including a change in height between the portion of the STI directly adjacent to the pFET and the portion directly adjacent to the nFET, which is formed in part as a result of processing subsequent to forming the hard-mask on the nFET.

Figure 6:
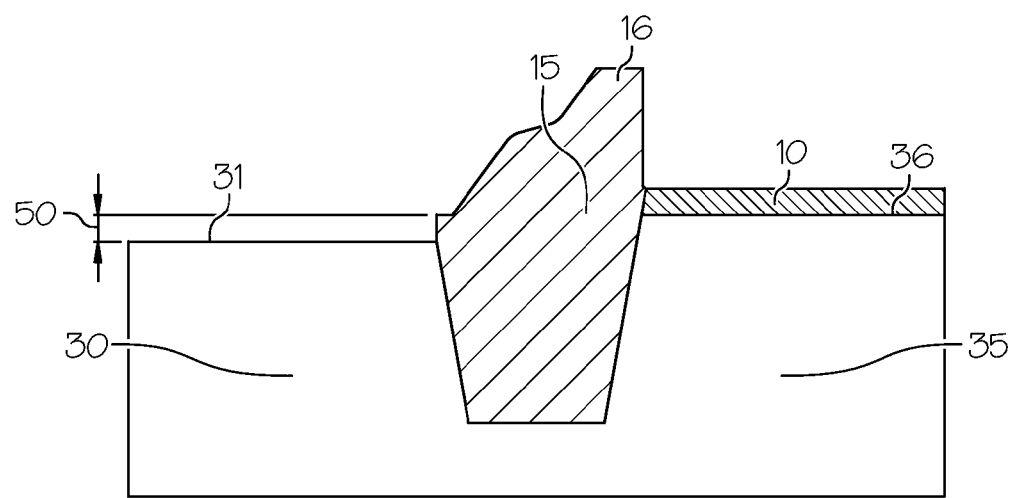

At FIG. 6, an APM solution is applied to the Si of the pFET 30 for recessing the active surface 31 of the pFET region 30 to a desired depth. The APM solution reacts chemically with the Si, and dissolves the Si to provide the recess depth 50. APM solutions are provided in concentrations with reference to the ammonia component thereof. For example, an APM solution may be given as 1:x:y, wherein "1" represents the ratio by mole fraction of ammonia present in the solution, "x" represents the ratio of hydrogen peroxide present in the solution with reference to the ammonia, and "y" represents the ratio of water present in the solution with reference to the ammonia.

In one embodiment, it has been discovered that the Si recessing process achieves desirable controllability, consistency, and uniformity when the APM is applied in a concentration wherein "x" is between about 1 to about 10, and wherein "y" is between about 2 to about 20. More preferably, "x" is between about 1 to about 5, and "y" is between about 5 to about 20. An exemplary concentration is about 1:1:5. A further exemplary concentration is about 1:4:20. It has further been discovered that the Si recessing process achieves desirable controllability, consistency, and uniformity when the APM solution is applied at a temperature between about 40° C. and about 80° C., such as between about 60° C. and about 65° C. An exemplary temperature is about 60° C. A further exemplary temperature is about 65° C.

In another embodiment, it has been discovered that the Si recessing process achieves desirably controllability, consistency, and uniformity when the APM is applied in a concentration wherein "x" is between about 1 to about 0.001, and wherein "y" is between about 1 to about 20. Exemplary concentrations of "x" include 0.001, 0.01, 0.1, or 1. Exemplary concentrations of "y" include 1, 5, 10 and 20. It has further been discovered that the Si recessing process achieves desirable controllability, consistency, and uniformity when the APM solution in this embodiment is applied at a temperature between about 20° C. and about 100° C. Exemplary temperatures include 60° C., 65° C., and 80° C.

In still other embodiments, other chemicals may be used in place of or in addition to the APM solutions described above. These alternative chemicals include, but are not limited to, choline hydroxide, ammonium hydroxide, tetraethylammonium hydroxide, CLк888™ (manufactured by Avantor Performance Materials, Inc. of Center Valley, Pa., USA), and EKC162™ (manufactured by DuPont Electronic Technologies of Hayward, Calif., USA). As used herein, choline hydroxide, ammonium hydroxide, tetraethylammonium hydroxide are provided in aqueous solution, and can range in concentration between about 1 molar and about 10 molar, for example, although higher and lower concentrations are possible.

In yet another embodiment, the process steps described above with regard to FIG. 5 and FIG. 6 can be combined into a single step to reduce the tooling capacity required to perform the fabrication of the integrated circuits and to reduce the amount of chemicals consumed in the process, thereby reducing the overall cost of the IC fabrication. In order to combine the pre-clean step of FIG. 5 and the recessing step of FIG. 6, the APM solution (and/or other chemical solution as noted above) is combined with the dHF oxide etchant into a single solution. It has been discovered that the combined pre-clean/recessing step is preferable, and can be performed using a dHF concentration that is about 1:300.

In order to avoid the detrimental formation of step-height differences and divots, the Si of the pFET 30 is recessed to a depth sufficient to allow a subsequently-grown silicon-based material channel, for example a SiGe channel, to achieve a height approximately equal to the height of the active nFET surface 36 (i.e., the resulting active pFET surface 31 and the active nFET surface 36 will be approximately equal or coplanar with respect to one another). As such, the pFET 30 is preferably recessed to a depth between about 2 nm to about 20 nm, and more preferably between about 4 nm and 8 nm. Exemplary recess depths 50 include depths of 6 nm and 8 nm. The time period required to achieve such a recess depth 50 will depend upon the concentration of APM solution used and the desired recess depth. However, it has been found that, using the ranges of concentrations and temperatures described above, times ranging between about 5 minutes and about 60 minutes, or more preferably between about 15 minutes and 50 minutes, are desirable for achieving a sufficient pFET Si recess 50. Exemplary time periods include about 15 minutes, about 25 minutes, and about 50 minutes. After recessing the pFET 30, the pFET 30 may optionally be cleaned using another HF solution to remove an impurities or imperfections on the surface thereof and to terminate the Si surface with Hydrogen.

Figure 1:
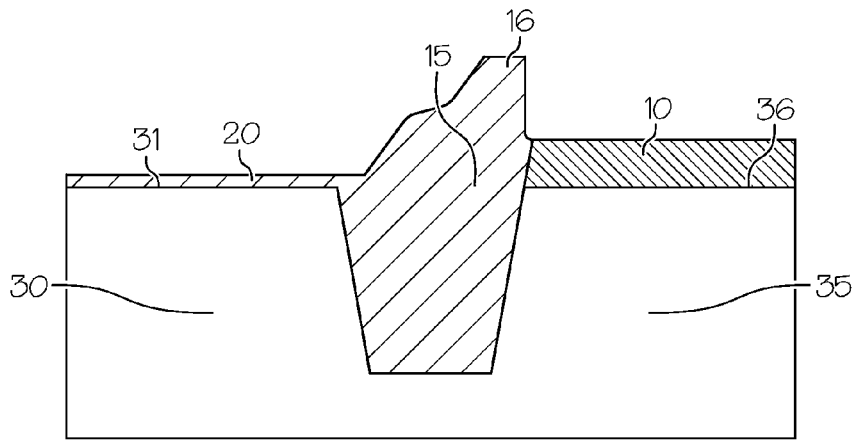
FIGS. 1-3 are cross-sectional views of an integrated circuit illustrating method steps in the fabrication of the integrated circuit with an SiGe channel that can result in step-height differences and divot formation.
Figure 2:
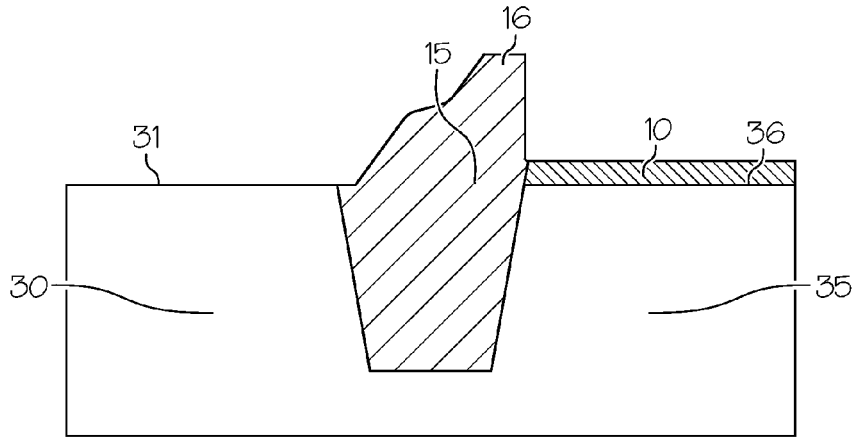
Figure 3:
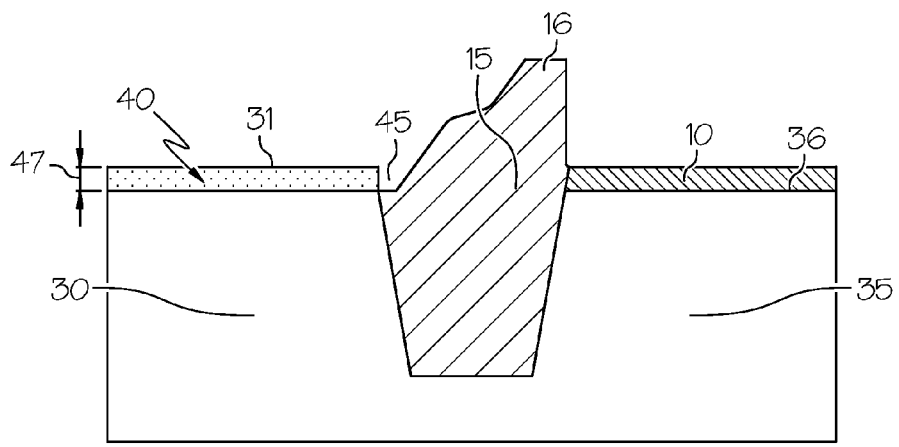
Figure 4:
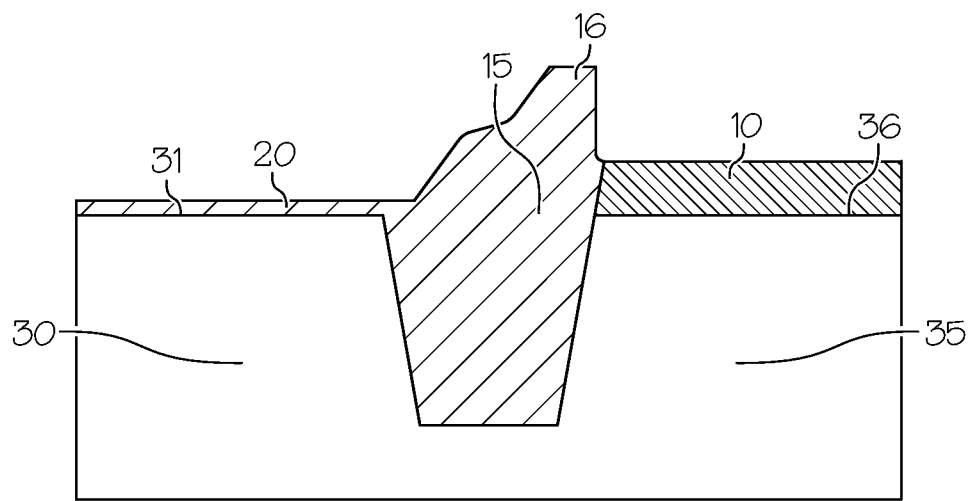
FIGS. 4-7 are cross-sectional views of an integrated circuit illustrating method steps in the fabrication of the integrated circuit with a SiGe channel using an ammonia-hydrogen peroxide-water (APM) solution.
Figure 7:
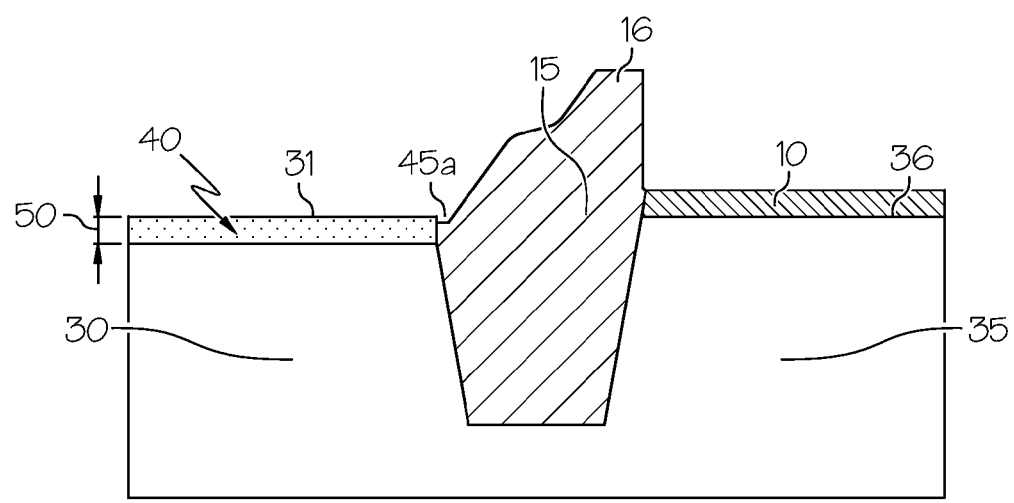

At FIG. 7, SiGe is epitaxially grown on the pFET 30 to form a SiGe channel 40. As shown, due to the recess 50 in the pFET 30, the deposited SiGe channel 40 (i.e., the pFET active surface 31) reaches a height roughly equivalent to that of the active nFET surface 36, desirably resulting in a minimal or negligible step-height difference. Further, the deposited SiGe channel 40 reaches a height roughly equivalent to that of the adjacent STI 15, desirably resulting in minimal or negligible divot formation (a divot 45a is shown, greatly reduced in size as compared to FIG. 3 divot 45). Further processing steps, as will be known to those having ordinary skill in the art, can thereafter be used to remove the hard-mask covering the nFET 35 and the portion of the STI 15 extending to the height of the hard-mask 10.

Although not illustrated, the integrated circuit is completed in conventional manner by, for example, forming one or more gate electrodes, forming one or more source/drain regions, providing electrical contacts to the source/drain regions and to the gate electrodes, etc. The conventional processing may further include, for example, depositing interlayer dielectrics, etching contact vias, filling the contact vias with conductive plugs, and the like as are well known to those of skill in the art of fabricating semiconductor circuits. The subject matter disclosed herein is not intended to exclude any subsequent processing steps to form and test the completed integrated circuit as are known in the art.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. It should be understood that various changes can be made in the function and arrangement of elements without departing from the scope of the invention as set forth in the appended claims and the legal equivalents thereof.

What is claimed is:

1. A method for fabricating an integrated circuit from a semiconductor substrate having formed thereon over a first portion of the semiconductor substrate a hard mask layer over an active surface of the first portion and having formed thereon over a second portion of the semiconductor substrate an oxide layer over an active surface of the second portion, the first portion and the second portion being electrically isolated by a shallow trench isolation feature, wherein the active surface of the second portion is substantially parallel to the active surface of the first portion, and wherein the hard mask layer extends to a height above the active surface of the first portion that is higher than a height above the active surface of the second portion to which the oxide layer extends, the method comprising:
  removing the oxide layer from over the second portion to expose a surface region of the second portion and simultaneously reducing a height of the hard mask layer by applying a dilute hydrogen fluoride etching solution;
  recessing the surface region of the second portion by applying an ammonia-hydrogen peroxide-water (APM) solution over both portions to form a recessed surface region, the APM solution being provided in a concentration of ammonium to hydrogen peroxide ranging from about 1:1 to about 1:0.001 and in a concentration of ammonium to water ranging from about 1:1 to about 1:20;
  wherein recessing the surface region of the second portion comprises recessing the surface region to a depth between about 2 nm and about 20 nm,
  wherein recessing the surface region of the second portion comprises recessing the surface region at a temperature between about 40° C. and about 80° C.; and
  epitaxially growing a silicon-germanium (SiGe) layer on the recessed surface region of the second portion,
  wherein growing the SiGe comprises growing to a height that is approximately parallel with the active surface of the first portion.

2. The method of claim 1, wherein recessing the surface region of the second portion comprises recessing the surface region for a time period between about 5 minutes and about 60 minutes.

3. The method of claim 1, further comprising cleaning the recessed surface region subsequent to recessing the surface region of the second portion by applying a second dilute hydrogen fluoride solution.

4. The method of claim 1, wherein applying the dilute hydrogen fluoride etching solution comprises applying an about 1:300 dilute hydrogen fluoride etching solution.

5. A method for fabricating an integrated circuit from a semiconductor substrate having formed thereon over a first portion of the semiconductor substrate a hard mask layer and having formed thereon over a second portion of the semiconductor substrate an oxide layer, the first portion and the second portion being electrically isolated by a shallow trench isolation feature, the method comprising:

removing the oxide layer from over the second portion to a surface region of the second portion and recessing the surface region of the second portion in a single process step by applying a solution of about 1:300 dilute hydrogen fluoride solution and one or more of: choline hydroxide, ammonium hydroxide, tetraethylammonium hydroxide, sulfolane, a mixture of hydroxylamine and quaternary ammonium hydroxide, and ammonia-hydrogen peroxide-water (APM) to form a recessed surface region, wherein if an APM solution is applied, the APM solution being provided in a concentration of ammonium to hydrogen peroxide ranging from about 1:10 to about 1:0.001 and in a concentration of ammonium to water ranging from about 1:1 to about 1:20; and epitaxially growing a silicon-germanium (SiGe) layer on the recessed surface region to a height approximating a surface region of the first portion below the hard mask layer.

6. The method of claim 5, wherein recessing the surface region of the second portion comprises recessing the surface region to a depth between about 2 nm to about 20 nm.

7. The method of claim 6, wherein recessing the surface region of the second portion comprises recessing the surface region to a depth between about 4 nm to about 8 nm.

8. The method of claim 5, wherein recessing the surface region of the second portion comprises recessing the surface region at a temperature between about 40° C. and about 80° C.

9. The method of claim 5, wherein recessing the surface region of the second portion comprises recessing the surface region for a time period between about 5 minutes and about 60 minutes.

10. The method of claim 5, further comprising cleaning and hydrogen termination of the recessed surface region subsequent to recessing the surface region of the second portion by applying a second dilute hydrogen fluoride solution.

* * * * *